US006938117B2

(12) United States Patent
Roohparvar

(10) Patent No.: US 6,938,117 B2
(45) Date of Patent: Aug. 30, 2005

(54) TRI-STATING OUTPUT BUFFER DURING INITIALIZATION OF SYNCHRONOUS MEMORY

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 10/352,397

(22) Filed: Jan. 28, 2003

(65) Prior Publication Data

US 2003/0115427 A1 Jun. 19, 2003

Related U.S. Application Data

(63) Continuation of application No. 09/802,269, filed on Mar. 8, 2001, now Pat. No. 6,549,975.

(51) Int. Cl.[7] ............................................. G06F 13/00
(52) U.S. Cl. ..................... 711/104; 711/103; 711/105; 711/154; 711/166; 711/167; 710/10
(58) Field of Search ...................... 711/103–105, 154, 711/166, 167; 710/10; 714/36; 713/112

(56) References Cited

U.S. PATENT DOCUMENTS

| | | | | |
|---|---|---|---|---|
| 4,862,350 A | * | 8/1989 | Orr et al. ..................... 709/213 |
| 5,224,124 A | | 6/1993 | Hamano et al. | |
| 5,414,305 A | * | 5/1995 | Nakamura et al. ............. 326/62 |
| 5,469,376 A | * | 11/1995 | Abdallah ..................... 708/446 |
| 5,615,159 A | | 3/1997 | Roohparvar | |
| 5,677,885 A | | 10/1997 | Roohparvar | |
| 5,736,867 A | | 4/1998 | Keiser et al. | |
| 5,751,641 A | | 5/1998 | Petrosino | |
| 5,760,607 A | | 6/1998 | Leeds et al. | |
| 5,875,353 A | | 2/1999 | Whetsel | |
| 5,956,277 A | * | 9/1999 | Roohparvar ................. 365/201 |
| 5,959,485 A | * | 9/1999 | Roohparvar ................. 327/227 |
| 5,983,314 A | | 11/1999 | Merritt | |
| 6,052,321 A | * | 4/2000 | Roohparvar ................. 365/201 |
| 6,178,501 B1 | | 1/2001 | Ingalls | |
| 6,246,623 B1 | | 6/2001 | Ingalls | |
| 6,246,626 B1 | | 6/2001 | Roohparvar | |
| 6,275,961 B1 | * | 8/2001 | Roohparvar ................. 714/718 |
| 6,307,790 B1 | * | 10/2001 | Roohparvar et al. ... 365/189.05 |
| 6,549,975 B2 | * | 4/2003 | Roohparvar ................. 711/104 |

FOREIGN PATENT DOCUMENTS

EP          0173070 A2 *  5/1986  ............ G06F/11/00

* cited by examiner

*Primary Examiner*—T Nguyen
(74) *Attorney, Agent, or Firm*—Leffert Jay & Polglaze PA

(57) ABSTRACT

A synchronous memory device that avoids erroneous output while internal initialization is taking place. In one embodiment, a tri-state logic circuit is used to selectively tri-state an output buffer during memory initialization. The output buffer is used to output data from a memory array to DQ lines. Tri-stating the output buffer floats the DQ lines. Thus, data in the DQ lines is not output in response to commands. Control circuitry signals the tri-state logic circuit to tri-state the output buffer during initialization. In another embodiment, an external processor can be used to provide a read status command to the memory to determine the status of memory initialization. In this embodiment, tri-stating the output buffer during initialization is momentarily overridden to respond to the read status command.

15 Claims, 3 Drawing Sheets

TRI-STATING OUTPUT BUFFER DURING INITIALIZATION OF SYNCHRONOUS MEMORY

TECHNICAL FIELD OF THE INVENTION

This Application is a Continuation of U.S. application Ser. No. 09/802,269 (allowed) filed Mar. 8, 2001, now U.S. Pat. No. 6,549,975. The present invention relates generally to memory devices and in particular the present invention relates to tri-stating an output buffer during initialization of a synchronous memory.

BACKGROUND OF THE INVENTION

Memory devices are typically provided as internal storage areas in the computer. The term "memory" identifies data storage that comes in the form of integrated circuit chips. There are several different types of memory. One type is RAM (random-access memory). This is typically used as main memory in a computer environment. RAM refers to read and write memory; that is, you can both write data into RAM, and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively. at a time. Many modern PCS have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

Generally, all synchronized memory devices require system circuits within the device to be initialized before the memory can be powered up for reliable operation. The initialization process generally includes setting registers for proper operations. It takes a period of time to complete the initialization process. During this time, the memory device can have unknown internal signals and data states. As a result of the unknown states, non-valid data may be sent through output buffers of the memory system causing the system to read faulty data.

For the reasons stated above, and for other reasons stated below which will become apparent to those skilled in the art upon reading and understanding the present specification, there is a need in the art for a memory that avoids erroneous output while internal initialization is taking place.

SUMMARY OF THE INVENTION

The above-mentioned problems with non-valid data being sent during initialization and other problems are addressed by the present invention and will be understood by reading and studying the following specification.

In one embodiment, the present invention provides a synchronous memory device that comprises a memory array, an output buffer that outputs data from the memory array, a tri-state logic circuit that selectively tri-states the output buffer and control circuitry to signal the tri-state logic circuit to tri-state the output buffer during memory initialization. The synchronous memory device can also include a pair of DQMASK connections to signal the tri-state logic circuit to tri-state the output buffer manually with external commands.

In another embodiment, a synchronous flash memory device comprises, a memory array of non-volatile memory cells, an output buffer to output data from the memory array, a tri-state logic circuit to selectively tri-state the output buffer during initialization and control circuitry to signal the tri-state logic circuit to tri-state the output buffer during memory initialization.

In another embodiment, a memory system comprises an external processor and a synchronous memory that is coupled to the external processor. The synchronous memory comprises a memory array, an output buffer to output data from the memory array, a tri-state logic circuit to selectively tri-state the output buffer and control circuitry to signal the tri-state logic circuit to tri-state the output buffer during memory initialization. The memory system can also include the external processor providing a read status command to the memory to determine the status of memory initialization.

A method of operating a non-volatile memory that includes tri-stating an output buffer of the memory while the memory is being initialized. One method including starting initialization of the memory, tri-stating an output buffer of the memory, finishing initialization of the memory and returning the output buffer to normal operation after initialization of memory is completed.

Another method of operating a memory system includes starting initialization of a memory, tri-stating an output buffer during initialization of the memory, polling the memory to verify the status of initialization, and allowing an external processor to access the memory upon verification of completion of memory initialization. Optionally, the method can include overriding the tri-state condition of the output buffer to signal the external processor that initialization is occurring.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Most synchronous memory devices require initialization of the system circuits before the system becomes operational. An example of a recently developed synchronous memory requiring initialization is a synchronous Flash memory. A synchronous Flash memory combines the non-volatile storage capabilities of Flash memory with an SDRAM 100 mHz read-compatible interface.

Figure 1:
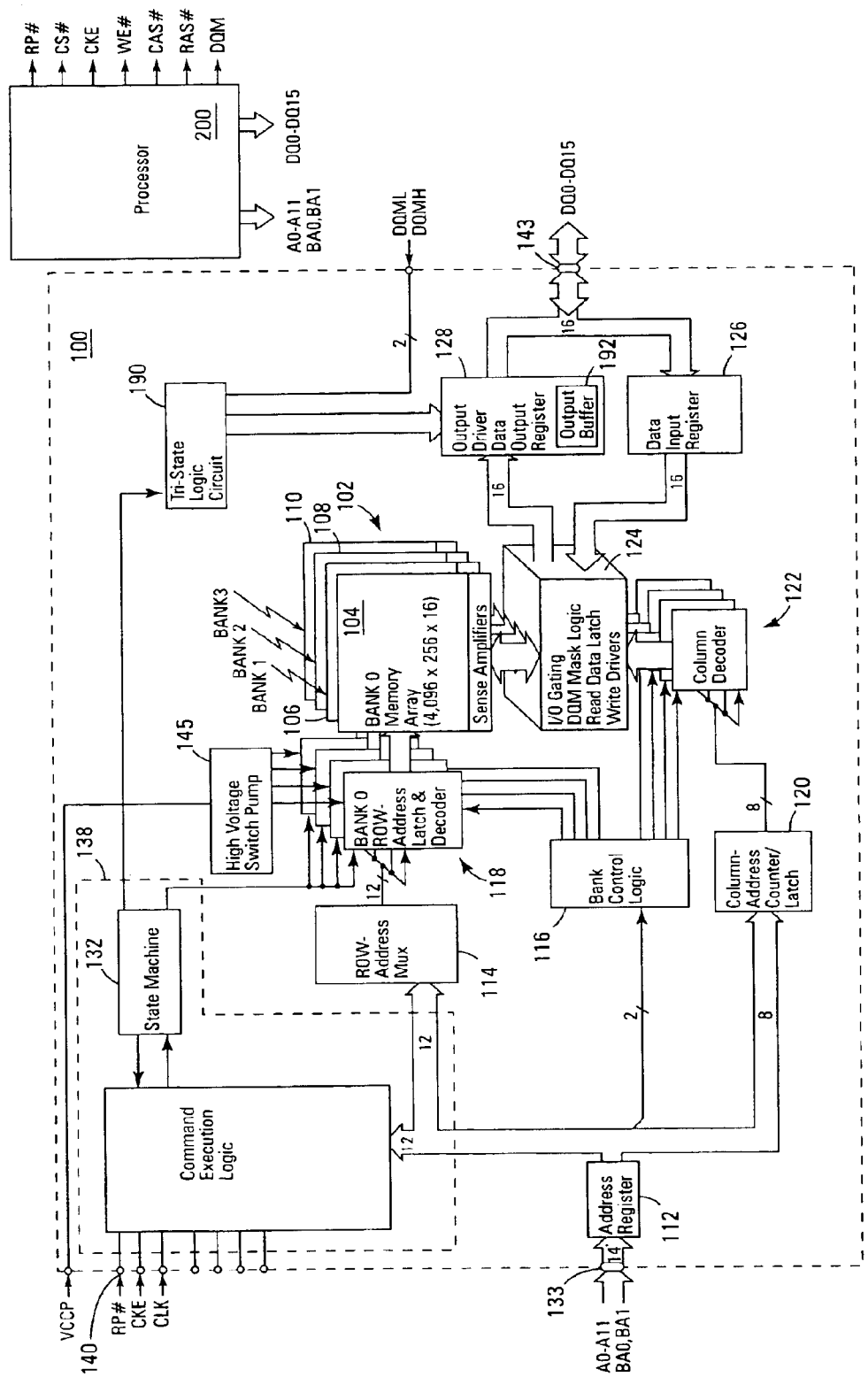
FIG. 1 is a block diagram of a synchronous flash memory of the present invention.

Referring to FIG. 1, a block diagram of one embodiment of a synchronous Flash memory is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 via address signal connections. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, read data latch circuitry and write driver circuitry. Data is input through data input registers 126 and output through circuit 128 via data connections. Circuit 128 includes data output registers, an output driver and an output buffer 192. Command execution logic 130 is provided to control the basic operations of the memory device. A state machine 132 is also provided to control specific operations performed on the memory array and cells. A status register 134 and an identification register 136 can also be provided to output data. The command circuit 130 and/or state machine 132 can be generally referred to as control circuitry 138 to control read, write, erase and other memory operations. The data connections are typically used for bi-directional data communication. The memory can be coupled to an external processor 200 for operation or testing.

Figure 2:
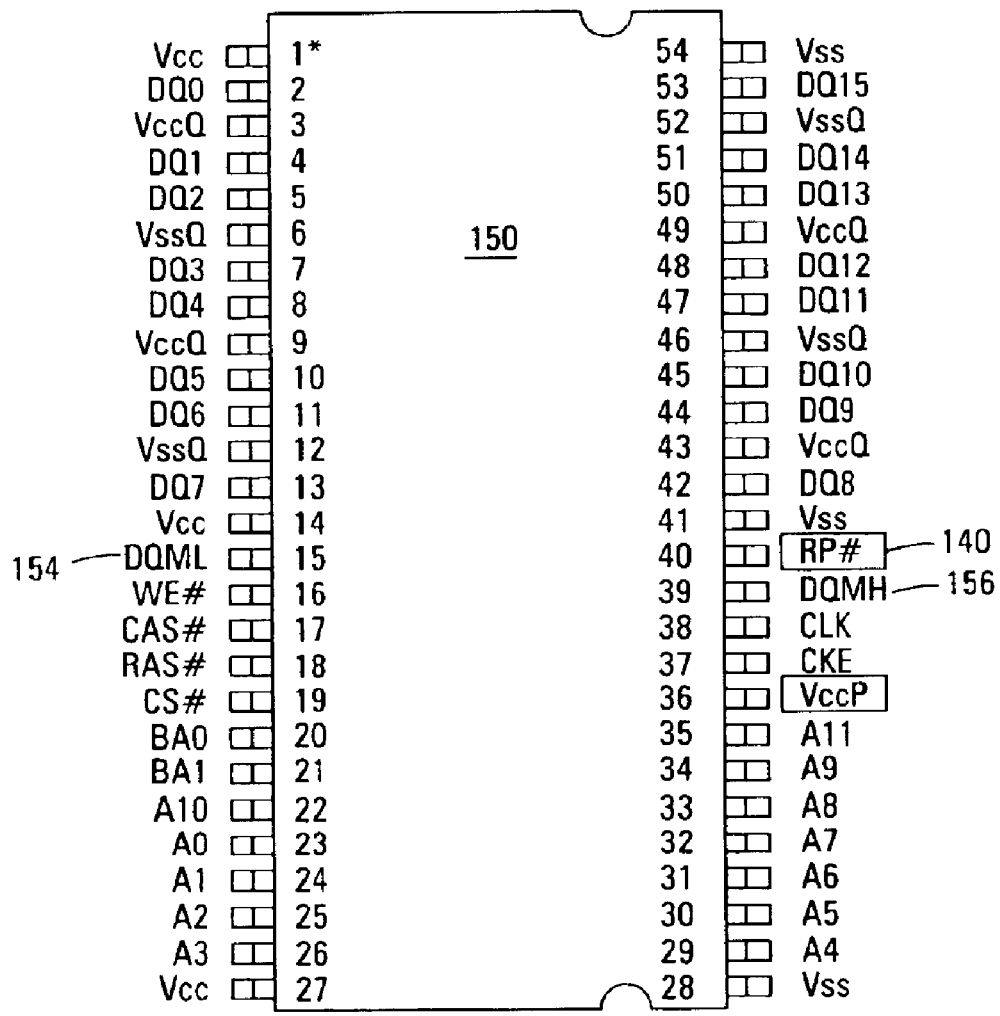
FIG. 2 is an integrated circuit pin interconnect diagram of one embodiment of the present invention.

FIG. 2 illustrates an interconnect pin assignment of a synchronous Flash memory. The memory package 150 has 54 interconnect pins. The pin configuration is substantially similar to available SDRAM packages. Although they may share interconnect labels that appear the same as SDRAM's, the function of the signals provided on the interconnects are described herein and should not be equated to SDRAM's unless set forth herein.

Prior to describing the operational features of the memory device, a more detailed description of the interconnect pins and their respective signals is provided. The input clock connection is used to provide a clock signal (CLK). A system clock can drive the clock signal, and all synchronous flash memory input signals are sampled on the positive edge of CLK. CLK also increments an internal burst counter and controls the output registers.

The input/output mask (DQMASK) connections are used to provide input mask signals for write accesses and an output enable signal for read accesses. Input data is masked when DQMASK is sampled HIGH during a WRITE cycle. The output buffers are placed in a high impedance (High-Z) state (after a two-clock latency) when DQMASK is sampled HIGH during a READ cycle. DQML 154 corresponds to lower address data connections DQ0–DQ7 and DQMH 156 corresponds to upper address data connections DQ8–DQ15. DQML 154 and DQMH 156 are considered to be the same state when referenced as DQM.

A reset input (RP#) connection 140 is used for reset and power-down operations. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. A VCCQ connection is used to provide isolated power to the DQ connections to improved noise immunity. In one embodiment, VCCQ=Vcc or 1.8V±0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

Synchronous flash memory has numerous non-volatile storage registers (fuse elements) that contain data used during operation, such as adjusting the internal settings of the device. Some of this information is required before any operation can be performed. Such information could include the location of memory rows or columns in the array that have been replaced with redundant elements. As such, this information must be read at power up. In allowing the information to be read, the information is transferred from the non-volatile storage registers to the volatile storage registers during memory initialization.

The synchronous flash memory of FIG. 1 is powered up and initialized in a predefined manner. After power is applied to VCC, VCCQ and VCCP (simultaneously), and the clock signal is stable, RP# 140 is brought from a LOW state to a HIGH state. A delay is needed after RP# transitions HIGH in order to complete internal device initialization.

Once internal device initialization has been completed, the memory is placed in an array read mode and is ready for Mode Register programming or an executable command.

Initialization of the memory 104 takes a specific period of time. A memory system must have a way to deal with this time requirement. One method is by holding off normal operations of the memory 104 for a specific period of time. For example, in one embodiment, a period of 100 µs is set aside for the memory 104 to initialize upon power up. The 100 µs is the time given by the memory system to ensure proper initialization. It will be appreciated by those skilled in the art that the length of initialization will vary with memory designs and that the present invention is not limited to 100 µs. A downfall to this embodiment is that the memory 104 may take less than 100 µs to actually complete initialization. Therefore the extra time given by the memory system for initialization is wasted.

Another way to deal with the initialization time requirement is by monitoring the memory 104 to determine when it completes initialization. By monitoring the memory 104, the overall time a memory system takes before it is ready for normal operations can be shortened. For example, if the memory system is given 100 µs to initialize but it only takes 50 µs, the memory system would be ready for normal operations 50 µs sooner using the monitoring method. In an embodiment that monitors the memory 104, the period of time for initialization is controlled by a read status command from an external processor 200. In this embodiment, the external processor 200 polls the memory 104, asking the memory 104 if it has completed initialization. If the external processor 200 finds that the memory 104 is busy conducting an initialization operation, the external processor 200 continues to poll the memory 104. When the external processor 200 polls the memory 104 and finds the memory 104 is not performing an initialization operation, the external processor 200 begins accessing the memory.

In another embodiment that is designed to shorten the amount of time required before a memory system is ready for normal operations, the memory 104 is designed to notify the external processor 200 when initialization has been completed. The memory 104 in this embodiment provides an output signal on its DQ lines 143 that indicates the completion of initialization for the external processor 200 to read. Thus, the external processor 200 is notified once the initialization of the memory 104 has been completed. The external processor 200 can then begin accessing the memory 104.

A problem can occur during the time the memory 104 is being initialized, as the memory 104 generally has a lot of unknown states during that period of time. As a result of the unknown states, non-valid data may be sent through the output buffer 192. The present invention tri-states an output buffer 192 of a memory system during initialization to prevent the memory system from reading faulty data. It will be appreciated by those skilled in the art that noise signals can be present on both control lines and data buses. The present invention helps reduce the noise experienced on the memory data bus. That is, the generation of additional noise on the data bus is avoided during initialization in response to faulty input signals. As such, the present invention prevents the memory from compounding existing data bus noise.

Figure 3:
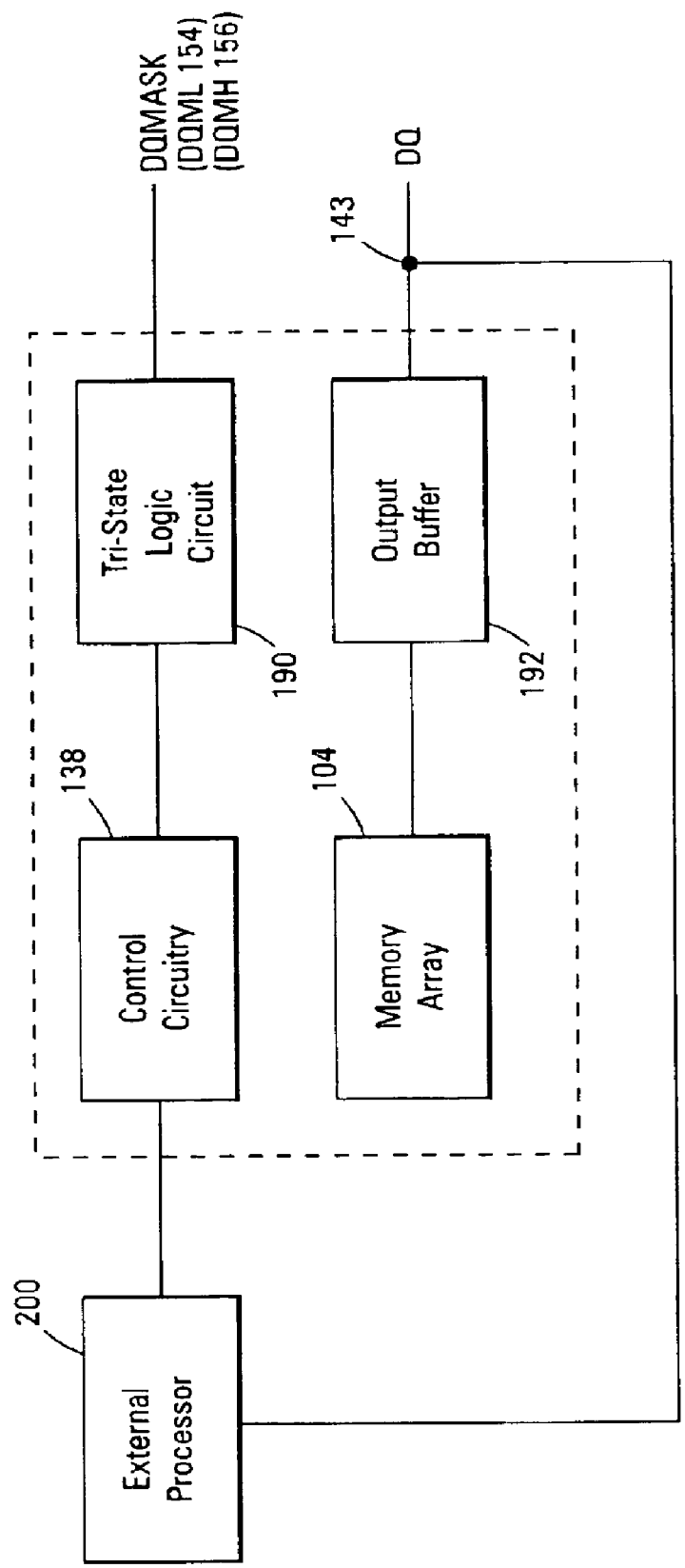
FIG. 3 is a block diagram of the present invention.

As illustrated in FIG. 3, one embodiment of the present invention includes control circuitry 138, a tri-state logic circuit 190 and an output buffer 192. The tri-state logic circuit 190 is used to tri-state the output buffer 192 upon direction of the control circuitry 138. Tri-stating the output buffer 192 floats the DQ lines 143. Thus, if the output buffer 192 is tri-stated, data in the DQ lines 143 is not output in response to commands. The control circuitry 138 signals the tri-state logic circuit 190 to tri-state the output buffer 192 during initialization.

In an embodiment that uses a status command request from an external processor 200 to poll the memory 104 once initialization has started, the tri-state condition is momentarily overridden during initialization to provide a response to the status command request. That is, once a status command request has been received from the external processor 200, the tri-state logic circuit stops tri-stating the output buffer 192 until a signal is send through the DQ lines 143 to the external processor 200 indicating that the memory 104 is conducting an initialization operation. Once the signal has been sent, the tri-state logic circuit 190 once again tri-states the output buffer 192 until another status command request is received or until the memory 104 has completed initialization. Once the external processor 200 receives a signal back from the memory 104 that initialization is complete, the external processor 200 begins accessing the memory.

In an alternative embodiment, the control circuitry 148 may direct the tri-state logic circuit 190 to tri-state state the output buffer 192 for a specific period of time once initialization has commenced. By setting a defined time period for initialization of a memory 104, the need to have the memory send a signal upon completion of initialization or the need to monitor the memory 104 for completion of initialization is eliminated.

As illustrated in FIG. 3, the tri-state logic circuit is also coupled to the DQMASK connections (DQML 154 and DQMH 156). The DQMASK connections 154 and 156 allow the output buffer 192 to be manually tri-stated with external commands. This provides the user with the ability to toggle the output signal. For example, the DQMASK connections 154 and 156 can be used to mask a portion of data that needs to be blocked from being written.

CONCLUSION

A synchronous memory device that avoids generating erroneous output signals while internal initialization is taking place has been described. In one embodiment, a tri-state logic circuit is used to selectively tri-state an output buffer during memory initialization. The output buffer is used to output data from a memory array to DQ lines. Tri-stating the output buffer floats the DQ lines. Thus, data in the DQ lines is not output in response to commands. Control circuitry signals the tri-state logic circuit to tri-state the output buffer during initialization. In another embodiment, an external processor can be used to provide a read status command to the memory to determine the status of memory initialization. In this embodiment, tri-stating the output buffer during initialization is momentarily overridden to respond to the read status command.

What is claimed is:

1. A memory device comprising:
    a memory array;
    a plurality of data connections for outputting data from the memory device;
    an output buffer, coupled between the memory array and the plurality of data connections, to output data from the memory array; and
    control circuitry to control output of signals through the output buffer during memory initialization such that the memory array is isolated from the plurality of data connections during the memory initialization.

2. The memory device of claim 1 and further comprising:
a pair of DQMASK connections coupled to the control circuitry, wherein the DQMASK connections signal the control circuitry to tri-state the output buffer manually with external commands.

3. The memory device of claim 2 wherein the DQMASK connections further comprise:
a DQML connection, wherein DQML corresponds to lower address data connections; and
a DQMH connection, wherein DQMH corresponds to upper address data connections.

4. A flash memory device comprising:
a memory array of non-volatile memory cells;
a plurality of data connections for outputting data from the memory device;
an output buffer, having a tri-state mode and coupled between the memory array and the plurality of data connections, to output data from the memory array; and
control circuitry to control tri-stating of the output buffer during memory initialization such that the memory array is isolated from the plurality of data connections during the memory initialization.

5. The flash memory device of claim 4 and further comprising:
a pair of DQMASK connections being coupled to the control circuitry, wherein the DQMASK connections signal the control circuitry to tri-state the output buffer manually with external commands.

6. A synchronous memory device comprising:
a memory array;
a plurality of data connections for outputting data from the memory device;
an output buffer coupled between the memory array and the plurality of data connections to output data from the memory array, the output buffer having a tri-state condition; and
control circuitry to selectively tri-state the output buffer for a predefined period of time upon commencement of memory initialization such that the memory array is isolated from the plurality of data connections during the memory initialization.

7. The synchronous memory device of claim 6 wherein the predetermined period of time is the amount of time required for memory initialization.

8. A memory system comprising:
an external processor; and
a memory device coupled to the external processor, the device comprising:
a memory array;
a plurality of data connections for outputting data from the memory device;
an output buffer, coupled between the memory array and the plurality of data connections, to output data from the memory array; and
control circuitry to control output of signals through the output buffer during memory initialization such that the memory array is isolated from the plurality of data connections during the memory initialization.

9. A flash memory device comprising:
a memory array of non-volatile memory cells;
a plurality of non-volatile storage registers to contain information used during memory operations;
a plurality of volatile storage registers, each volatile storage register being coupled to an associated one of the plurality of non-volatile storage registers;
an output buffer to output data from the memory array, the output buffer having a tri-state condition;
a plurality of data connections to provide output data from the output buffer; and
control circuitry to perform initialization of the memory, wherein the control circuitry enables the tri-state condition during initialization of the memory such that the memory array is isolated from the plurality of data connections by the output buffer during the memory initialization.

10. The flash memory device of claim 9 wherein initialization of the memory includes copying information stored in the non-volatile storage registers to the volatile storage registers.

11. The flash memory device of claim 9 wherein the control circuitry has input connections to receive status command requests from an exterior processor, wherein the control circuitry provides responses to the status command requests.

12. The flash memory device of claim 11 wherein the control circuitry overrides the tri-state condition to respond to the status command request.

13. A synchronous memory device comprising:
a memory array;
an output buffer to output data from the memory array, the output buffer having a selectable tri-state condition; and
control circuitry to generate a control signal to cause the output buffer to enter the tri-state condition only during memory initialization such that the memory array is isolated by the output buffer during the memory initialization.

14. A synchronous memory device comprising:
a memory array;
output buffer to output data from the memory array, the output buffer having a selectable tri-state condition; and
control circuitry to cause the output buffer to enter the tri-state condition during memory initialization such that the memory array is isolated by the output buffer during the memory initialization, the control circuitry capable of overriding the tri-state condition to provide a response to a status command request.

15. A memory system comprising:
an external processor; and
a synchronous memory coupled to the external processor, the synchronous memory capable of receiving a read status command from the external processor to determine the status of a memory initialization, the synchronous memory comprising:
a memory array;
an output buffer to output data from the memory array, the output buffer having a selectable tri-state condition; and
control circuitry to cause the output buffer to enter the tri-state condition during the memory initialization such that the memory array is isolated by the output buffer during the memory initialization.

* * * * *